(12) United States Patent  
Tam

(10) Patent No.: US 6,580,359 B1
(45) Date of Patent: Jun. 17, 2003

(54) SELECTABLE INPUT BUFFER CONTROL SYSTEM

(75) Inventor: Kimo Y. F. Tam, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/428,707

(22) Filed: Oct. 28, 1999

(51) Int. Cl.[7] ............................................. G06F 13/00
(52) U.S. Cl. ...................... 340/14.1; 365/200; 365/233; 326/27; 326/83; 370/413
(58) Field of Search ...................... 340/14.1; 365/200, 365/233; 326/27, 83; 370/413

(56) References Cited

U.S. PATENT DOCUMENTS

| | | | | |
|---|---|---|---|---|
| 5,245,585 A | * | 9/1993 | Voss et al. ............... | 365/238.5 |
| 5,315,174 A | * | 5/1994 | Chang et al. .................. | 326/27 |
| 5,541,535 A | * | 7/1996 | Cao et al. ...................... | 326/83 |
| 5,544,104 A | * | 8/1996 | Chauvel ................ | 365/189.01 |
| 5,561,773 A | * | 10/1996 | Kalish et al. ............... | 710/104 |
| 5,625,780 A | * | 4/1997 | Hsieh et al. ................ | 710/316 |
| 5,933,770 A | * | 8/1999 | Helter ......................... | 455/307 |
| 6,166,570 A | * | 12/2000 | Hedberg ..................... | 327/108 |
| 6,287,765 B1 | * | 9/2001 | Cubicciotti .................... | 435/6 |
| 6,335,638 B1 | * | 1/2002 | Kwong et al. ................ | 326/83 |

* cited by examiner

Primary Examiner—Daryl Pope
(74) Attorney, Agent, or Firm—Iandiorio & Teska

(57) ABSTRACT

A selectable input buffer control system includes at least one input buffer; a plurality of input receivers associated with each input buffer; an addresser circuit for addressing each input receiver; and a selection circuit associated with each input buffer for enabling its associated input buffer in response to the addressing of any one or more of the input receivers associated with that input buffer.

13 Claims, 4 Drawing Sheets

SELECTABLE INPUT BUFFER CONTROL SYSTEM

FIELD OF INVENTION

This invention relates to a selectable input buffer control system.

BACKGROUND OF INVENTION

Buffer circuits are wisely used in analog and digital circuits to broadcast a signal to one or more receiver circuits which may be as simple as a point cell in a crosspoint circuit or as complex as a microprocessor. The buffers may serve several purposes: restoring logic levels, providing gain, level shifting, etc. However, one of the most important functions of the buffers is to isolate the source from input admittance (usually capacitive) of the receivers and the wires leading to them by providing a unilateral signal path, usually with high input impedance and low output impedance. An important disadvantage of the buffers is their power consumption.

Prior art crosspoint switches often employ some form of input buffer to isolate the external input signals from the input busses in both analog and digital implementations. At its core is an array of point cells, in which each row constitutes a multiplexer. A separate latch drives the address bus of each row and these address lines are connected to the local decoding circuitry within each point cell in such a way as to ensure that at most one point cell in a row is enabled at any time. The outputs of the points in each row are connected to an output buffer which drives the external load. Input busses, each driven by an input buffer, are connected to the input terminals of the point cells in their respective columns. All input buffers in this architecture are always (regardless of the state of the crosspoint matrix) enabled and dissipating power to drive replicas of their input signals onto their respective input busses. Some prior art crosspoint switch implementations save power and area by omitting the input buffers. Since the input resistance of the point cells is relatively high (several MΩ), matching to the source is typically achieved using an off-chip termination resistor to ground.

One prior art digital crosspoint switch uses the distributed inductance of the input bus in conjunction with its distributed capacitance and the input capacitance of the point cells to form a transmission line which is an extension of the transmission line feeding the crosspoint chip. The geometry of the input bus line is adjusted to match its characteristic impedance to that of the off-chip line. Although impedance discontinuities may exist at the chip interface due to package parasitics, reflections at the end of the on-chip line are minimized by an on-chip termination resistor. By controlling the impedance of the input bus and terminating it, this technique mitigates the effects of the on-chip input bus capacitance without buffers. On-chip transmission lines with on-chip termination resistors have a number of shortcomings. The on-chip resistor uses a substantial amount of power; it requires another on-chip component and the fabrication process produces a ±10% or even ±20% variation in the resistance value. Further, that resistance is fixed and cannot match the different characteristic impedances of the various input lines to which it may be connected. In addition, in applications where internal termination resistors are used in each cross-point circuit, the biasing of an input to more than one cross-point circuit causes a serious impedance mismatch because of the paralleling of all of the termination resistors.

SUMMARY OF THE INVENTION

It is therefore an object of this invention to provide an improved selectable input buffer control system It is a further object of this invention to provide such an improved selectable input buffer control system which uses less power.

It is a further object of this invention to provide such a selectable input buffer control system which enables an input buffer to broadcast only if at least one of its receivers is listening.

It is a further object of this invention to provide such a selectable input buffer control system which provides all the advantages of buffered input systems, e.g., lower input capacitance, higher input sensitivity, controlled source impedance, controlled common-mode levels, small lower power equalized logic swings, but reduces required power and cross talk.

The invention results from the realization that an improved selectable input buffer control system which reduces power requirements and cross-talk can be effected with a selector circuit associated with each of one or more input buffers for enabling the associated input buffer in response to the addressing of any one or more of the input receivers associated with that input buffer.

This invention features a selectable input buffer control system including a plurality of input receivers arranged in rows and columns and a number of input buffers, one associated with each column, for driving input receivers in that column. There is an address circuit for addressing each input receiver in a row. A selection circuit is associated with each input buffer for enabling its associated input buffer in response to the addressing of any one or more of the input receivers in that column associated with that input buffer.

In a preferred embodiment the selection circuit may include a single control conductor between the input receivers and their associated input buffer. Each input buffer may include a driver circuit. Each selection circuit may include a disabling signal source for disabling the driver of the associated input buffer and a switching device in each of the input receivers associated with that driver for overriding the disabling that driver when one or more of the input receivers associated with that driver has been addressed. Each selection circuit may include a disabling signal source for disabling the driver of the associated input buffer, a switched current source in each of the input receivers associated with that driver for overriding the disabling signal and enabling that driver when one or more of the input receivers associated with that driver has been addressed. Each selection circuit may include a current sensing circuit for sensing the total current in the selection circuit and adjusting the output resistance of that driver in inverse proportion to the number of associated input receivers addressed to maintain a stable RC constant and propagation delay.

The invention also features a selectable input buffer control system including at least one input buffer and a plurality of input receivers associated with each input buffer. There is an address bus for addressing each input receiver and a selection circuit associated with each of the input buffers for enabling its associated input buffer in response to the addressing of any one or more of the input receivers associated with that input buffer.

In a preferred embodiment the selection circuit may include a single control conductor between the input receivers and their associated input buffer. Each input buffer may include a driver circuit. Each selection circuit may include a disabling signal source for disabling the driver of the associated input buffer and a switching device in each of the input receivers associated with that driver for overriding the disabling that driver when one or more of the input receivers associated with that driver has been addressed. Each selection circuit may include a disabling signal source for disabling the driver of the associated input buffer, a switched current source in each of the input receivers associated with that driver for overriding the disabling signal and enabling that driver when one or more of the input receivers associated with that driver has been addressed. Each selection circuit may include a current sensing circuit for sensing the total current in the selection circuit and adjusting the output resistance of that driver in inverse proportion to the number of associated input receivers addressed to maintain a stable RC constant and propagation delay.

BRIEF DESCRIPTION OF THE DRAWINGS

Other objects, features and advantages will occur to those skilled in the art from the following description of a preferred embodiment and the accompanying drawings, in which.

The invention disclosed herein efficiently enables these buffer circuits only as needed. In a crosspoint switch having M inputs and N outputs, each of the inputs is bussed to up to N point cells. However, if none of the points to which a particular input signal is connected is enabled, then that input can be switched off by selectively disabling the input buffer. Doing so saves the power otherwise wasted by the input buffer and also eliminates one source of crosstalk. In a rectangular crosspoint switch array having more inputs than outputs (M>N), there will always be at least M−N input buffers whose inputs are unused. However, even in a square switch array (M=N), some inputs will be connected to multiple outputs, leaving other inputs unused. Minimization of power in the unused input channels is paramount to minimizing system power dissipation in a large switch matrix built from many M×N unit crosspoint ICs, since the majority of I/O channels in the units are not selected. For instance, in a basic 160×160 switch made from 100 unit 16×16 crosspoint ICs, at most 160 of the 1600 IC input buffers needs to be enabled.

Figure 1:
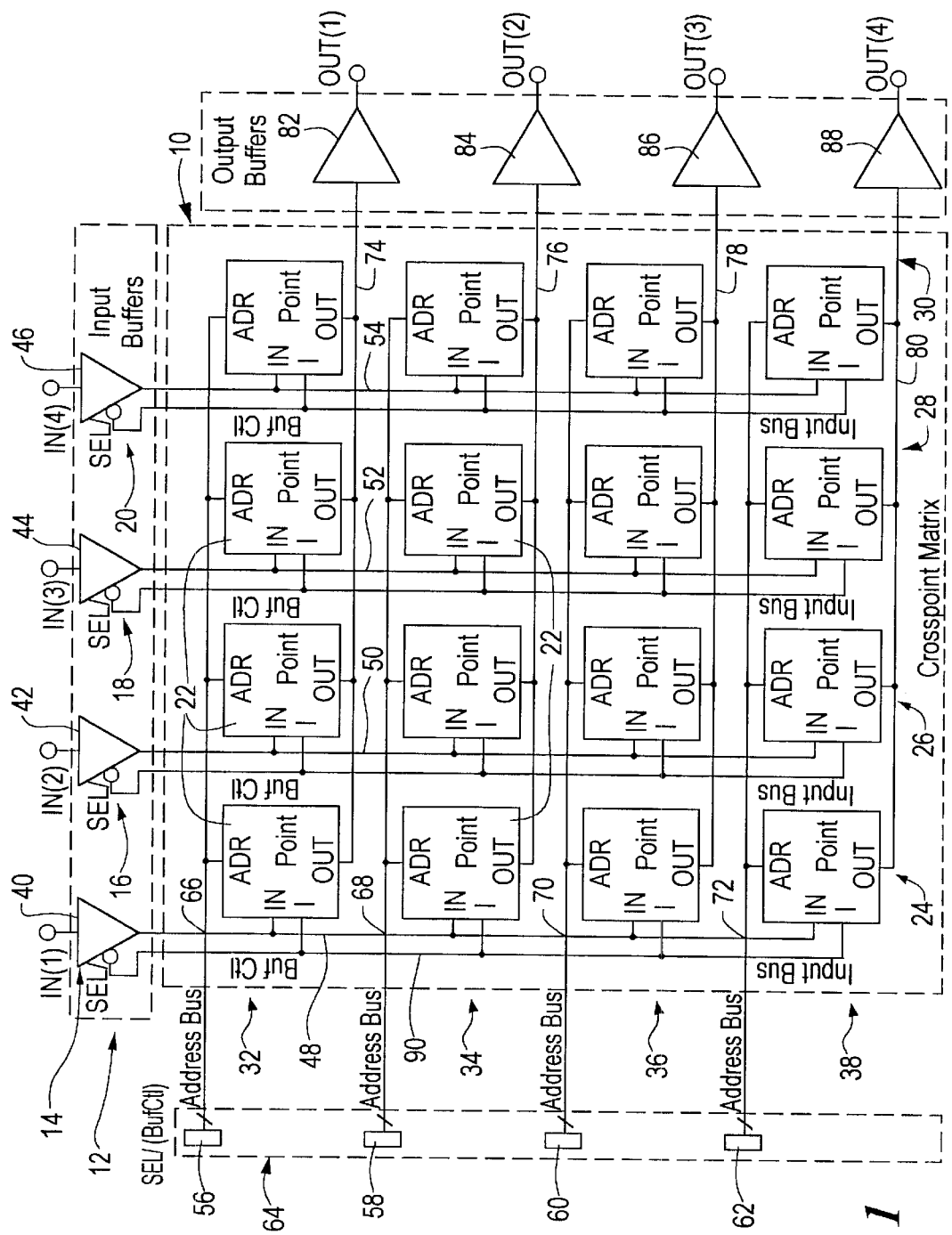
FIG. 1 is a schematic block diagram of a crosspoint switch employing a selectable input buffer control system according to this invention.

There is shown in FIG. 1 a crosspoint switch 10 which employs the selectable input buffer control system 12 according to this invention which includes each of the individual selectable input buffer control circuits 14, 16, 18 and 20. Crosspoint switch 10 includes a plurality of input receivers or input cells 22 arranged in a number of columns 24, 26, 28 and 30, and rows 32, 34, 36 and 38. Although these are arranged neatly in a matrix in an arrangement of rows and columns this is not a necessary limitation of the invention as the input receivers or cells could be arranged in any organized fashion of sets and subsets or cross-sets. In addition, the depiction of four rows and four columns is for illustrative purposes only as more or fewer rows and/or columns could be present.

In operation, inputs are applied to one or more of the input buffers 40, 42, 44 and 46 which then provide those inputs on their input busses 48, 50, 52 and 54. Those input cells 22 which receive an input on one of input busses 48, 50, 52 and 54, and which are properly addressed by their respective addressers 56, 58, 60 and 62 in addressing circuit 64, provide an output on address busses 66, 68, 70 and 72. Those input receivers or input cells which are addressed over address busses 66, 68, 70 and 72 and which have received an input on input busses 48, 50, 52 and 54, provide an output on output busses 74, 76, 78 and 80 to output buffers 82, 84, 86 and 88. In accordance with this invention, however, only the ones of input buffers 40, 42, 44 and 46 having in its column an input cell 22 which has been addressed is enabled by the selectable input buffer control circuits 14, 16, 18 and 20 of selectable input buffer control system 12. In this manner only the input buffers which must provide a signal to an input cell 22 is enabled. The rest are disabled, thereby saving the power they would ordinarily consume. In one implementation a selectable input buffer control circuit 14a, FIG. 2, includes a single conductor 90 which extends from a switching device 92, 94 . . . in each input receiver or input cell through a disabling signal source 96 to a driver 98 that forms a part of input buffer 40a. Switching device 92 also includes an input from decoder 91 which, when it receives its own address on address line 66, enables amplifier 93 to pass the input on input bus 48a to output bus 74, and also provides a signal on line 95 to operate switching device 92 to cause line 90 to provide the proper signal to enable driver 98.

Figures 2, 3:
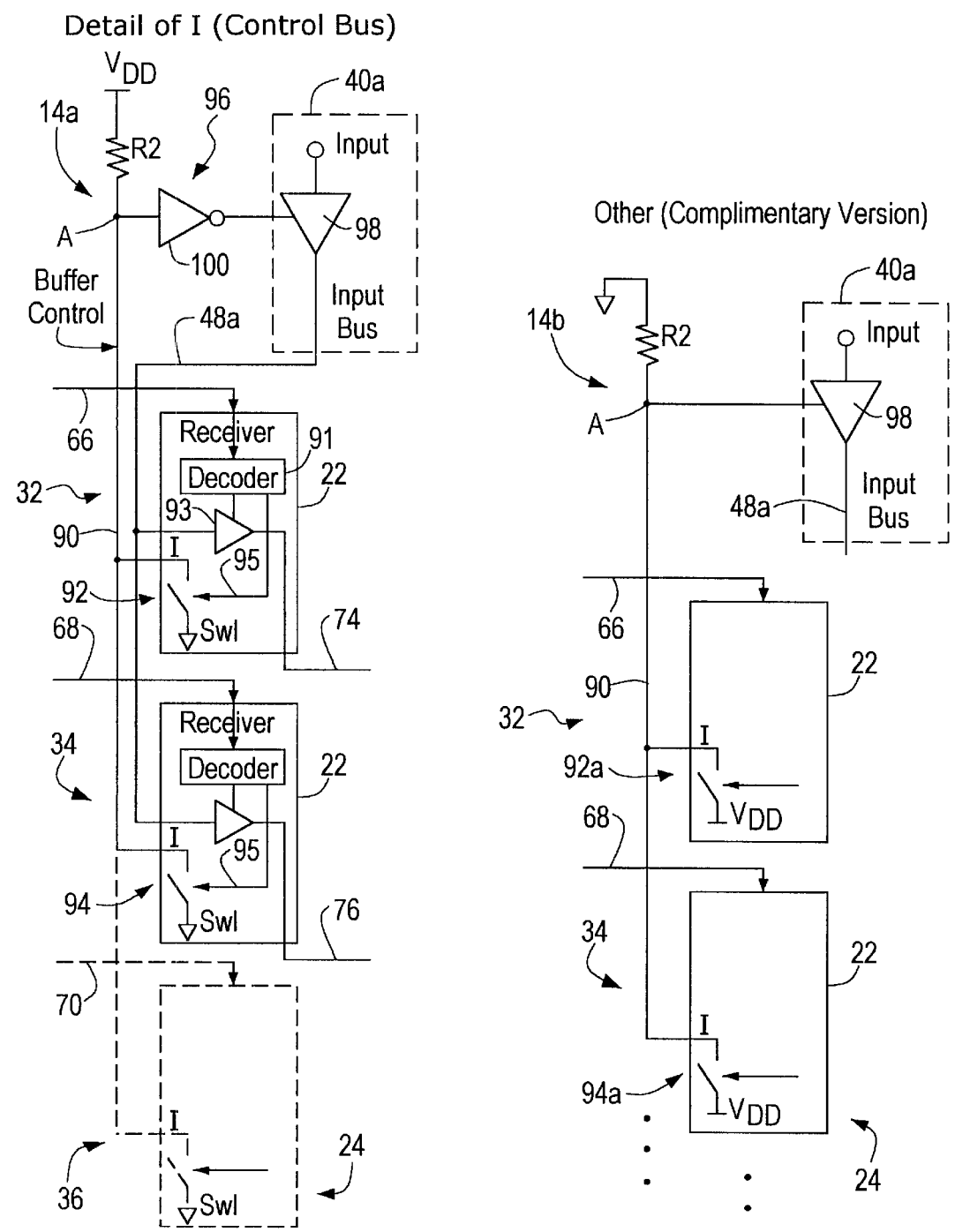
FIG. 2 is a schematic block diagram of a portion of the crosspoint switch of FIG. 1 showing the selectable input buffer control system according to this invention in greater detail.
FIG. 3 is a view similar to FIG. 2 but with the controlling voltages having reverse polarity.

Each switching device 92, 94 . . . may include a transistor or other kind of switching device shown simply as a single pole switch in FIG. 2. One end of each of those switching devices 92, 94 . . . is connected to ground. The other end is connected to conductor 90 which at point A is connected through resistance R2 to high voltage $v_{DD}$. Point A is also connected through an inverting amplifier 100 to driver 98 in input buffer 40a. If any one of the switching devices 92, 94 . . . in column 24 is closed, ground is connected to point A and driver 98 is enabled. If all of the switches are open, as shown in FIG. 2, point A is at the voltage $v_{DD}$ and the driver 98 is disabled. In this way only input buffers which have one or more input receivers addressed are enabled. The others are not.

Although in FIG. 2 switching devices 92, 94 . . . have been shown with their free end connected to ground, while the upper end of resistor R2 is connected to $v_{DD}$, this is not a necessary limitation of the invention as the converse could be true. That is, the lower connection of each of the switching devices 92a, 94a . . . could be connected to $v_{DD}$ as shown in FIG. 3 while the upper end of resistor R2 can be connected to ground as shown. The circuit of FIG. 3 works in a complementary fashion with respect to FIG. 2. That is, if any one or more of the switching devices 92a, 94a . . . are closed, point A is at $v_{DD}$ and driver 98 is enabled. If all of the switching devices 92a, 94a . . . are open, point A is at ground and driver 48 is disabled.

Generally the implementation of FIGS. 2 and 3 may be thought of as a type of digital implementation. This is not a necessary limitation of the invention. For example, selectable input buffer control circuit 14c, FIG. 4, includes a disabling signal source 96a which includes resistance R2 in a comparator or similar circuit 102 which compares the current flowing through conductor 90a and resistor R2 with a reference. This is done by tapping of the voltage at point A as one input 104 to comparator 102 and comparing it to a reference input 106. When comparator output 102 indicates that one or more of the switching devices 92a, 94a . . . is closed then the output on line 108 enables driver 98a in input buffer 40b. In this case, however, switching devices 92a, 94a . . . 98a include a switch 110 and a current source 112 as shown with respect to the topmost input receiver 22 in FIG. 4. If any one of the switches 110 is closed in any one of the input receivers or input cells 22 then its respective current source 112 would be connected to conductor 90a and cause an increase in the current through resistance R2 and thus an increase in the voltage drop from $v_{DD}$ to point A.

Figure 4:
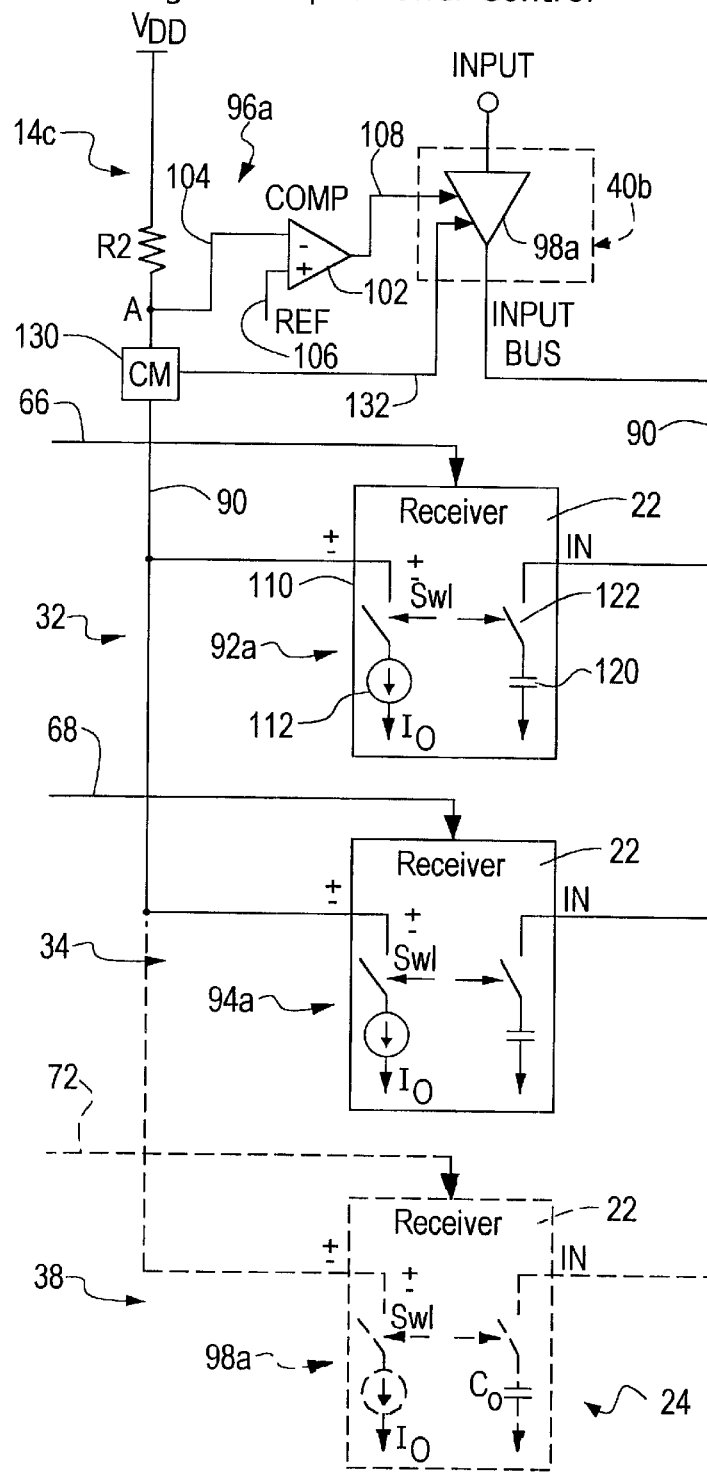
FIG. 4 is a view similar to FIGS. 2 and 3 showing a different implementation of the selectable input buffer control system according to this invention.

The analog type implementation shown FIG. 4 illustrates another feature of the invention wherein the output resistance of the driver 98a is controlled in proportion, or more precisely, in inverse proportion to the number of input receivers or input cells which have been addressed. That is, each cell 22, as indicated by the topmost cell shown in FIG. 4, has a capacitance 120 associated with it which can be considered to be switched in by switch 122 whenever that cell has been addressed and therefore placed on line with driver 98a. Switch 122 does not actually exist and capacitance 120 is not a specific capacitor but an intrinsic capacitance, but they are shown here in this equivalent form for ease of understanding. Each cell that is addressed adds to the capacitance on the input bus 90. With the increase in capacitance, the RC constant constituted by that capacitance and the resistance of driver 98a increases and thereby increases the propagation delay so that the circuit will have different characteristics for different configurations. This is undesirable and in accordance with this invention this can be overcome by placing a current mirror 130, analog to digital converter, or similar device as shown to sense the current in conductor 90. As that current increases indicating additional cells 22 being added to the load on driver 98a, that current is mirrored or a representative of that current is supplied on line 132 to driver 98a so as to decrease its output resistance on conductor 90. This decrease in output resistance offsets the increase in capacitance so that the RC constant remains virtually stable and the propagation delay does not substantially vary with the number of input cells 22 which have been addressed for a particular input buffer.

Figure 5:
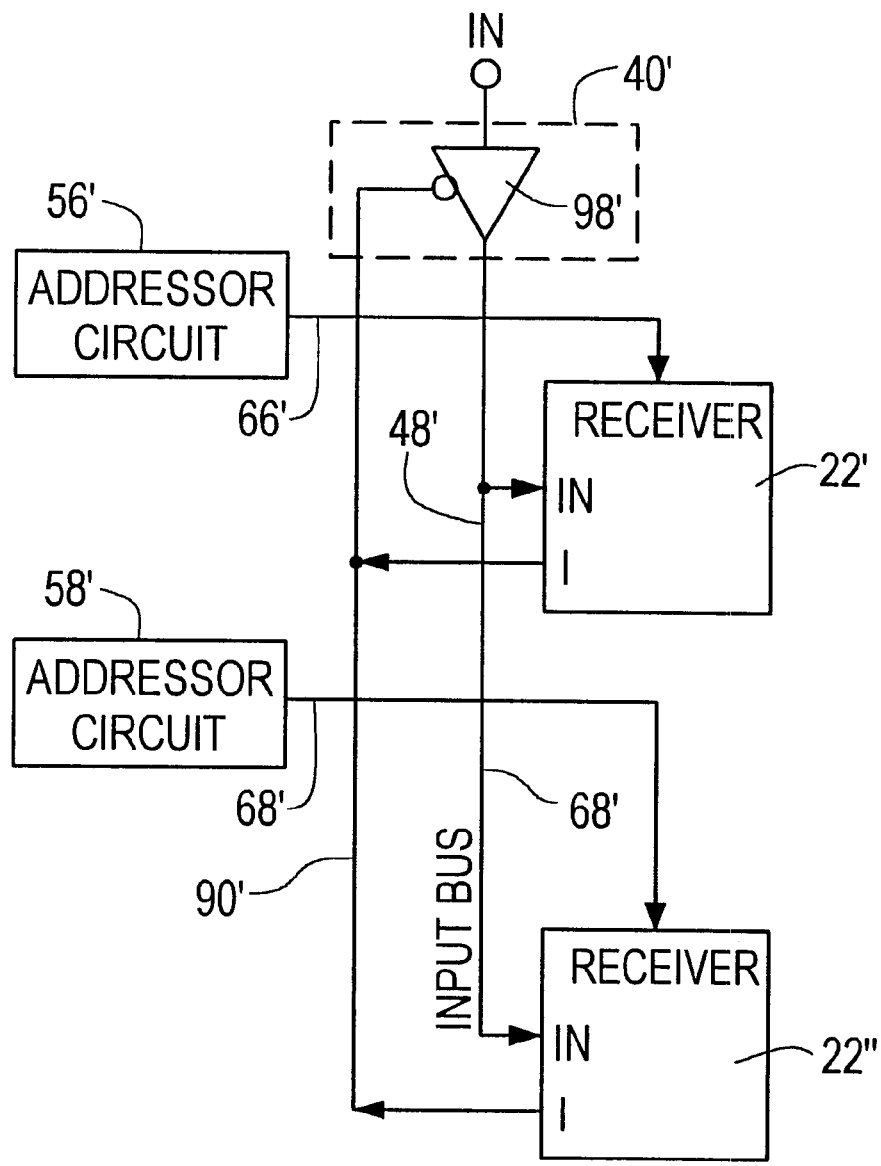
FIG. 5 is a schematic block diagram similar to FIG. 1 showing the selectable input buffer control system according to this invention controlling a simpler configuration of input receivers.

Although the example used thus far has been of a multi-column, multi-row group of input cells or input receivers, this is not a necessary limitation of the invention as the invention will work as well with mere plurality, two or more input receivers 22', 22", FIG. 5.

Although specific features of the invention are shown in some drawings and not in others, this is for convenience only as each feature may be combined with any or all of the other features in accordance with the invention.

Other embodiments will occur to those skilled in the art and are within the following claim.

What is claimed is:

1. A selectable input buffer control system comprising:
a plurality of input receivers arranged in rows and columns;
a number of input buffers one associated with each column for driving the input receivers in that column;
an address circuit for addressing each input receiver in a row; and
a selection circuit associated with each said input buffer for enabling its associated input buffer in response to the addressing of any one or more of said input receivers in the column associated with the input buffer.

2. The selectable input buffer control system of claim 1 in which said selection circuit includes a single control conductor between said input receivers and their associated input buffer.

3. The selectable input buffer control system of claim 1 in which each said input buffer includes a driver circuit.

4. The selectable input buffer control system of claim 3 in which each selection circuit includes a disabling signal source for disabling the driver of the associated input buffer and a switching device in each of said input receivers associated with that driver for overriding said disabling signal and enabling that driver when one or more of said input receivers associated with that driver has been addressed each said input buffer includes a driver circuit.

5. The selectable input buffer control system of claim 3 in which each said selection circuit includes a disabling signal source for disabling the driver of the associated input buffer, a switched current source in each of the input receivers associated with that driver for overriding said disabling signal and enabling that driver when one or more of said input receivers associated with that driver has been addressed.

6. The selectable input buffer control system of claim 3 in which each selection circuit includes a current sensing circuit for sensing the total current in said selection circuit and adjusting the output resistance of that drive in inverse proportion to the number of associated input receivers addressed to maintain a stable RC constant and propagation delay.

7. The selectable input buffer control system of claim 1 further comprising a plurality of output buffers, one associated with each row of input receivers for receiving an output from one of the input receivers in that row.

8. A selectable input buffer control system comprising:
at least one input buffer;
a plurality of input receivers associated with each input buffer;
an addresser circuit for addressing each input receiver; and
a selection circuit associated with each said input buffer for enabling its associated input buffer in response to the addressing of any one or more of said input receivers associated with that said input buffer.

9. The selectable input buffer control system of claim 8 in which said selection circuit includes a single control conductor between said input receivers and their associated input buffer.

10. The selectable input buffer control system of claim 8 in which each said input buffer includes a driver circuit.

11. The selectable input buffer control system of claim 10 in which each selection circuit includes a disabling signal source for disabling the driver of the associated input buffer and a switching device in each of said input receivers associated with that driver for overriding said disabling signal and enabling that driver when one or more of said input receivers associated with that driver has been addressed each said input buffer includes a driver circuit.

12. The selectable input buffer control system of claim 10 in which each said selection circuit includes a disabling signal source for disabling the driver of the associated input buffer, a switched current source in each of the input receivers associated with that driver for overriding said disabling signal and enabling that driver when one or more of said input receivers associated with that driver has been addressed.

13. The selectable input buffer control system of claim 10 in which each selection circuit includes a current sensing circuit for sensing the total current in said selection circuit and adjusting the output resistance of that device in inverse proportion to the number of associated input receivers addressed to maintain a stable RC constant and propagation delay.

* * * * *